United States Patent [19]
Van Buskirk et al.

[11] Patent Number: 6,100,200
[45] Date of Patent: Aug. 8, 2000

[54] SPUTTERING PROCESS FOR THE CONFORMAL DEPOSITION OF A METALLIZATION OR INSULATING LAYER

[75] Inventors: Peter C. Van Buskirk, Newtown; Michael W. Russell, Norwalk; Daniel J. Vestyck, Danbury, all of Conn.; Scott R. Summerfelt; Theodore S. Moise, both of Dallas, Tex.

[73] Assignee: Advanced Technology Materials, Inc., Danbury, Conn.

[21] Appl. No.: 09/218,563

[22] Filed: Dec. 21, 1998

[51] Int. Cl.[7] ................................... H01L 21/311
[52] U.S. Cl. .................. 438/697; 438/700; 438/702; 438/706; 438/710; 438/714; 438/720; 438/722; 438/584; 438/641; 438/648; 438/650; 438/652; 438/656; 438/715
[58] Field of Search ..................... 438/697, 700, 438/702, 706, 710, 714, 720, 722, 584, 641, 648, 650, 652, 656, 715

[56] References Cited

U.S. PATENT DOCUMENTS

| | | | |
|---|---|---|---|
| 4,430,791 | 2/1984 | Dockerty | 29/571 |
| 4,475,982 | 10/1984 | Lai et al. | 156/643 |
| 4,549,927 | 10/1985 | Goth et al. | 156/643 |
| 4,702,795 | 10/1987 | Douglas | 156/643 |
| 4,749,663 | 6/1988 | Okita | 437/228 |
| 4,858,556 | 8/1989 | Siebert | 118/664 |
| 4,992,306 | 2/1991 | Hochberg et al. | 427/255.3 |
| 5,024,957 | 6/1991 | Harame et al. | 437/31 |
| 5,087,586 | 2/1992 | Chan et al. | 437/72 |
| 5,246,885 | 9/1993 | Braren et al. | 437/225 |
| 5,427,972 | 6/1995 | Shimizu et al. | 437/52 |
| 5,445,988 | 8/1995 | Schwalke | 437/67 |
| 5,521,115 | 5/1996 | Park et al. | 437/60 |
| 5,550,077 | 8/1996 | Tseng et al. | 437/52 |
| 5,654,234 | 8/1997 | Shih et al. | 438/643 |
| 5,665,210 | 9/1997 | Yamazaki | 438/3 |
| 5,665,622 | 9/1997 | Muller et al. | 438/243 |
| 5,739,563 | 4/1998 | Kawakubo et al. | 257/295 |
| 5,753,551 | 5/1998 | Sung | 438/253 |
| 5,753,558 | 5/1998 | Akram et al. | 438/386 |
| 5,760,434 | 6/1998 | Zahurak et al. | 257/309 |
| 5,767,017 | 6/1998 | Armacost et al. | 438/694 |
| 5,792,686 | 8/1998 | Chen et al. | 438/244 |

OTHER PUBLICATIONS

*Semiconductor Materials and Process Technology Handbook for VLSI and ULSI*, Editor, Gary E. McGuire, Noyes Pub., 1986, pp. 440–443.

S. De Ornellas et al, "Plasma Etch of Ferroelectric Capacitors in FeRAMs and DRAMs", Semiconductor Int., vol. 20, No. 10, p. 103.

S. Hamaguchi et al., "Microprofile simulations for plasma etching with surface passivation" J.Vac. Sci. Tech. A., vol. 12, No. 5, 1994, p. 2745.

S. Hamaguchi et al, "Simulations of trench–filling profiles under ionized magnetron sputter metal deposition", J.Vac. Sci. Tech B., vol. 13, No. 1995, p. 183.

Robert Parsons *Thin, Film Processes II*, Edited by John L. Vossen and Werner Kern, Academic Press, p. 190.

*Primary Examiner*—Benjamin L. Utech
*Assistant Examiner*—Vanessa Perez-Ramos
*Attorney, Agent, or Firm*—OLiver A. Zitzmann

[57] ABSTRACT

The present invention is a method related to the deposition of a metallization layer in a trench in a semiconductor substrate. The focus of the invention is to sequentially perform heated deposition and etch unit processes to provide a good conformal film of metal on the inner surfaces of a via or trench. The deposition and etch steps can also be performed simultaneously.

50 Claims, 4 Drawing Sheets

BIAS VOLTAGE=0

BIAS VOLTAGE=−120V

SPUTTERING PROCESS FOR THE CONFORMAL DEPOSITION OF A METALLIZATION OR INSULATING LAYER

BACKGROUND OF THE INVENTION

1. Field of the Invention

The invention relates to a process for the deposition of a noble metal, barrier metal, or insulating layer in a trench or via in a semiconductor substrate to form a conformal electrode-metallization layer, barrier-metallization layer, or insulating layer.

2. Description of the Related Art

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench capacitors, as well as the utilization of new capacitor dielectric materials having higher dielectric constants.

U.S. Pat. No. 5,753,558 describes a typical prior art trench capacitor as shown in FIG. 1. It has a trench 4 in a silicon substrate 10 with a polysilicon bottom electrode 6, a dielectric layer 8, and a polysilicon top electrode 9 that fills in the trench.

With respect to dielectric materials there has been a major effort in semiconductor companies, worldwide, to commercialize high dielectric constant and ferroelectric thin films for capacitors in advanced DRAMs and ferroelectric random access memories (FeRAMs), respectively. These materials include $BaSrTiO_3$ (BST) for DRAMs and $PbZrTiO_3$ (PZT) and $SrBi_2Ti_2O_9$ (SBT) for FeRAMs. Due to the highly oxidizing conditions encountered during deposition of the dielectric, it is well known that these materials require electrodes comprised of noble metals or noble metal alloys such as Pt, Ir, $IrO_2$, Pt-Ru, etc. Still a further requirement is the sub-micron patterning of both the noble metals and the ferroelectric films.

Adverse interactions between the high dielectric constant material and both the substrate and metallization layer occur during device process steps including and following the deposition of the first metallization layer. A suitable barrier layer is employed to prevent unwanted reactions. A titanium nitride (TiN) barrier layer has been used between a platinum electrode and an aluminum metallization over $SrBi_2Ta_2O_9$ (SBT). A titanium tungsten (TiW) barrier layer has been used between a platinum or titanium electrode and an aluminum metallization over $PbZrTiO_3$ (PZT). In many cases a noble metal electrode and a barrier metal would be combined to form one composite metallization layer.

One of the critical considerations in depositing noble metal electrodes or barrier metallization layers is achieving a conformal film when depositing on non-planar structures such as trenches or vias. The problem is the geometric-shadowing and angle-of-incidence effects on coverage and microstructure. Thus when coating a step, deposition conditions that produce a dense structure on a flat surface yield a porous structure on the step side walls, and produce an open boundary or cusp emanating from the base of the step as a result of self-shadowing. "Semiconductor Materials and Process Technology Handbook" by Gary E. McGuire, Noyes Publications, 1988, PPS 440–443, hereby incorporated by reference, discloses details of step coverage and conventional solutions.

The techniques used to improve step coverage can be classified into the following broad categories: (1) source geometry adjustments, (2) step geometry shape adjustments, (3) substrate temperature control, and (4) bias sputtering.

Source geometry considerations are based on the fact that coating atoms approach a substrate surface in directions that are dependent on the geometric configuration of the deposition apparatus. Even in the case of sputtering at elevated pressures, the atoms approach the substrate line-of-sight from the point of last collision, which is nominally one mean free path from the substrate. A typical mean free path at 50 mTorr is of the order of 1 millimeter and therefore much larger than the step sizes.

The use of large source magnetron systems to deposit non-planar layers is advantageous for a number of reasons. In addition to providing improved source geometry adjustments to promote step coverage, they have the capacity for large production volumes and are compatible with in-line processing systems. In addition to magnetron sputtering sources, a wide range of sputter apparatus are available including ion beam and RF systems.

Step geometry shape control (i.e. tapered sidewalls in a step) is one of the most effective methods for reducing the geometric shadowing problems associated with step coverage. For example, a step slope of 30° from the normal in combination with suitable substrate motion can eliminate cusp formation due to shadowing.

Increasing the substrate temperature increases the adatom surface diffusion and tends to negate the effects of self-shadowing.

The combination of source geometry adjustments, tapered steps, and substrate heating has proven adequate for providing acceptable aluminum metallization on most conventional devices. However, the use of tapered sidewalls is not compatible with the footprint requirements and shrinking lateral dimensions of ULSI.

For devices requiring sub-micron tolerances, bias sputtering is used to provide step coverage. In the bias sputtering method, improvements in surface coverage are achieved by re-sputtering material previously deposited. Thus some of the material deposited at the bottom of a step in a surface is resputtered at small angles and redeposited on the sidewalls of the step. The bias voltage and current must be selected to provide a proper balance between the deposition and resputtering processes. FIG. 2 shows the effect of bias voltage in contouring $SiO_2$ films at a step. As the bias voltage increases the bias sputtering successfully eliminates crevice formation from the base of the step. Recent experiments have demonstrated that excellent step coverage of $SiO_2$ over straight edge profiles can be obtained with a combination of rf sputtering from a planar magnetron source and an rf bias applied to the substrates. Furthermore, it has been shown that proper programming of the deposition and re-sputtering will permit surface insulator layers to be leveled in anticipation of subsequent layers of metallization. The use of bias sputtering eliminates porosity and improves the step coverage.

SUMMARY OF THE INVENTION

The present invention is a method for improving the conformality of a metallization layer on the bottom and sidewalls of a trench or via on a semiconductor substrate. In one preferred embodiment of the invention, a plasma preetch precedes deposition of a first metal film that is deposited with a heated substrate and low deposition rate. Next, a plasma etch step is used to re-sputter the first metal film conformally onto the sidewalls of the trench. These two unit processes (deposition/etch) are repeated sequentially until a desired total thickness is achieved of a composite metallization layer such as a noble metal electrode and/or a barrier metal layer.

The metal deposition sequences are preferentially carrier out with the use of a directional grating or collimator. The use of a collimator, although it reduces the metal flux reaching the substrate, increases the fraction of incident metal ions that are at or near normal incidence to the substrate.

The substrate may be silicon or GaAs. The metallization layer may be an electrode comprised of a noble metal or noble metal alloy. Alternatively, the metallization may be a barrier layer metal used to separate the substrate and dielectric (for example PZT) or dielectric and further metallization.

DETAILED DESCRIPTION OF THE INVENTION

The present invention provides a sputtering method for improving the deposition of noble metals, barrier metals, oxides, nitrides, and oxynitrides conformally on the sidewalls and bottoms of three dimensional structures such as steps, vias, lines, islands, mesas or trenches. The method may be applicable to the process of making stack or trench capacitors for dynamic random access memory (DRAM) or providing for conformal electrode/barrier metallization for advanced ferroelectric random access memories (FeRAMs).

Referring now to FIG. 3, as a specific example of a microelectronic device structure fabrication process to which the method of the present invention may be applied, a description is set out below of a recessed stack capacitor process flow.

Figure 1:
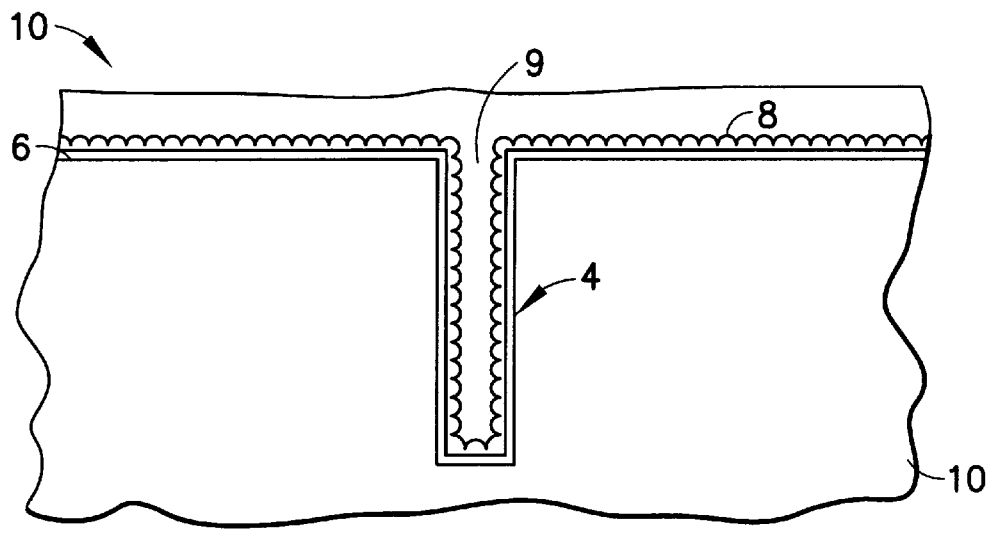
FIG. 1 is a diagrammatic view of a prior art trench capacitor.
Figure 2A:
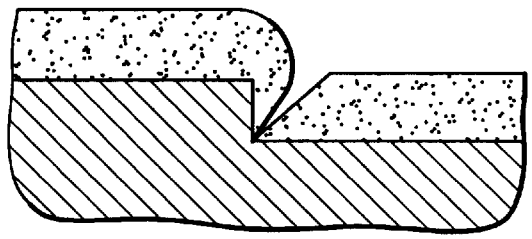
FIGS. 2a–b are diagrammatic views showing the effects of substrate bias on a sputtering process.
Figure 2B:
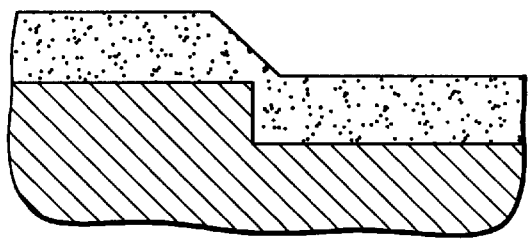
Figure 3A:
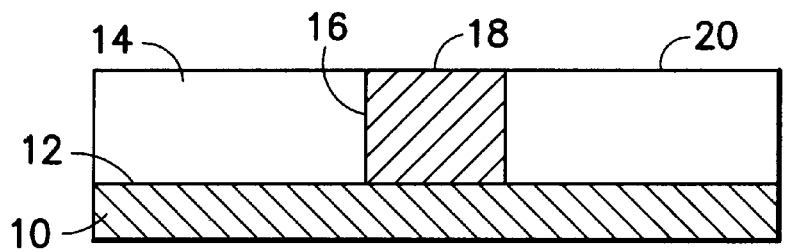
FIGS. 3a–h shows diagrammatic views of the steps for making a stack capacitor.

In FIG. 3A, a substrate 10 (typically formed of silicon, although other substrate materials of construction, such as GaAs, are possible) may be provided with transistors and other circuitry already fabricated below the wafer surface 12, according to conventional fabrication techniques. The silicon circuitry is covered with a dielectric insulating layer 14 (isolation dielectric) such as $SiO_2$, $Si_3N_4$, boron- or phosphorous-doped $SiO_2$, etc. Vias 16 to the Si circuitry are opened using photolithography and dry-etching, a plug 18 of suitable material, such as p-Si or W, is formed in the vias using CVD, and the surface 20 is planarized by dry etching, or by CMP processing.

Figure 3B:
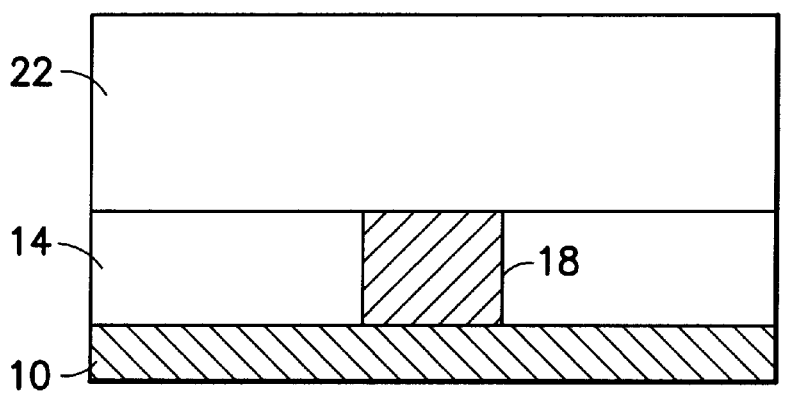

Next, shown in FIG. 3B, a capacitor recess dielectric 22, of a material such as $SiO_2$, $Si_3N_4$, boron- or phosphorous-doped $SiO_2$, etc., is formed over the surface of the plugs 18 and isolation dielectric 14 using CVD, sputtering or wet deposition methods.

Figure 3C:
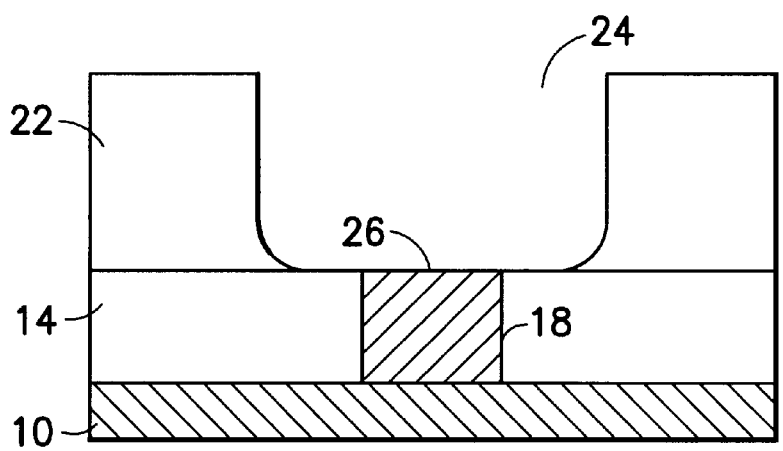

Capacitor recesses 24 are then formed in the surface of the insulating layer using photolithography and dry-etching. The top surface 26 of the conductive plug may then be sputter-etched or heat-treated, to ensure a clean surface prior to conductive barrier deposition in the next step (FIG. 3C).

Figure 3D:
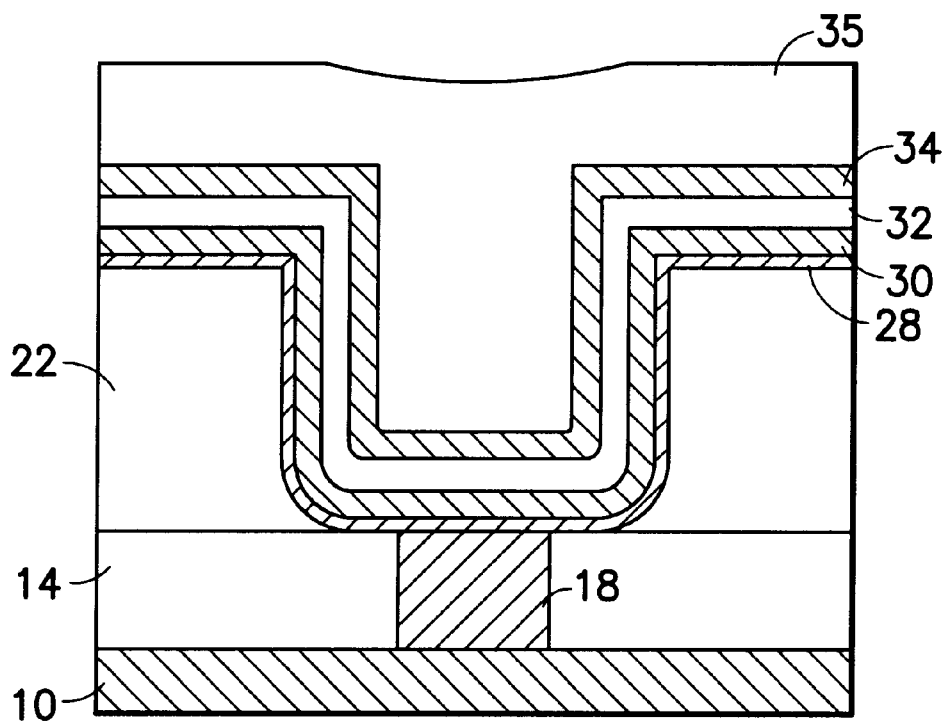
Figure 3E:
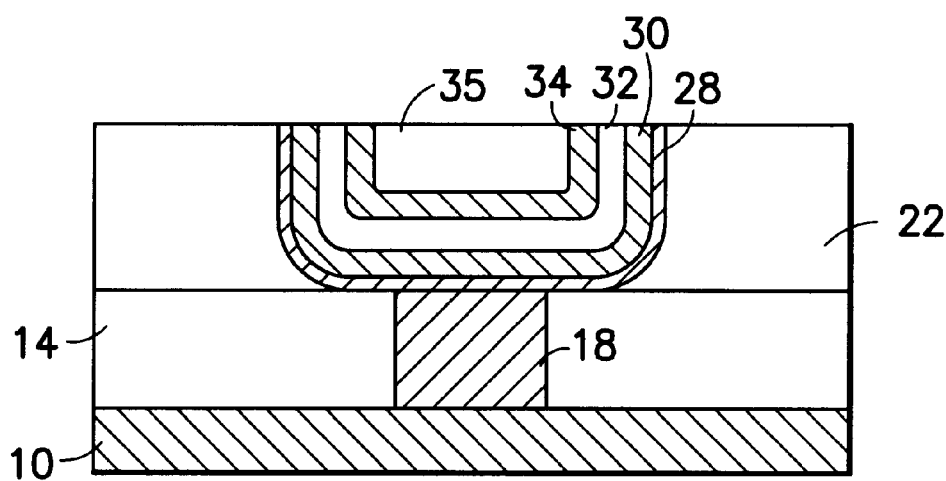

The conducting and insulating layers that will comprise the capacitor layers are next deposited. This is shown in FIG. 3D. The layers include (in the sequence they are deposited): a conductive barrier layer 28, the bottom electrode (BE) 30, the ferroelectric layer (FE) 32, and the top electrode (TE) 34. The conductive barrier layer may be TiN, TiSiN, TiAlN, $IrO_2$, SiC or some other material suitable to withstand oxidation and prevent diffusion of Si. The BE and TE layers are typically noble metals such as Pt, Pd, Ru, Ir, or Rh, conductive oxides of Ir, Rh or Ru, other conductive oxides such as $(Ba,Sr)RuO_3$, $(La,Sr)CoO_3$ or alloys of similar materials. In some instances, TE need not be a noble metal, since it does not need to withstand the highly oxidizing deposition environment of the dielectric. Under certain circumstances it may be possible to use a single layer for the conductive barrier layer and the BE layer by suitable post-processing to achieve the appropriate insulating or conducting properties as needed for the device. The FE layer material is typically PZT or SBT, but it may be bismuth titanate or some other ferroelectric thin film composition. (Alternatively it may be a similar multicomponent oxide such as BST for high capacitance, or $LaCaMnO_3$ for magnetoresistance, etc.)

It is evident that some sidewall coverage of these layers is necessary and the different layers require sidewall coverage for different reasons.

The barrier must cover the sidewall in order to make good adhesion between the BE and the capacitor recess dielectric. The BE must cover the sidewall to achieve adequate thickness for electrical continuity if the sidewall part of the structure is to be used for the chosen application. The dielectric must have adequate sidewall coverage to obtain uniform electrical properties in the capacitor, and to prevent short-circuiting between the TE and BE. For geometries >0.5 micron, the conductive layers can be deposited using sputtering, which results in adequate sidewall coverage. For smaller geometries or high aspect ratios in the capacitor recess, CVD of the conductive layers may be needed. CVD of the FE layer will generally be needed to prevent shorting between the TE and BE, although there may be cases where the FE can be sputtered with satisfactory results.

Next (FIG. 3E) a dielectric layer 35 is deposited over the stack structure and the entire structure is patterned using chemical mechanical polishing. Alternatively, the stack may be defined using conventional photoresist processing and etching.

Figure 3F:
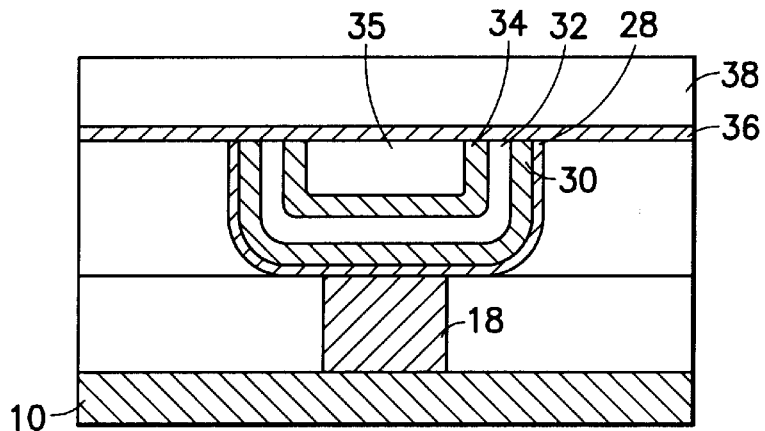

As shown in FIG. 3F, an insulating passivation layer 36 and an inter-level dielectric (ILD) 38 are then sequentially deposited over the capacitors formed in the previous step. This barrier is deposited using CVD, sputtering or wet deposition methods, and its purpose is to prevent undesirable chemical reactions and interdiffusion between the top edge of the ferroelectric film or electrodes and the overlying ILD layer that typically contains Si or $SiO_2$. PZT and SBT in particular contain the highly chemically reactive and mobile species of Pb and Bi, respectively, and it is important to prevent interdiffusion of those or similar species with the ILD layer. The passivation layer may be $TiO_2$, $ZrO_2$, $Ta_2O_5$, $Si_3N_4$ or other similar dielectric materials that include mixtures of those materials too. The ILD may be formed of $SiO_2$, $Si_3N_4$, boron- or phosphorous-doped $SiO_2$, etc., and is suitably deposited using CVD, sputtering or wet deposition methods.

Figure 3G:
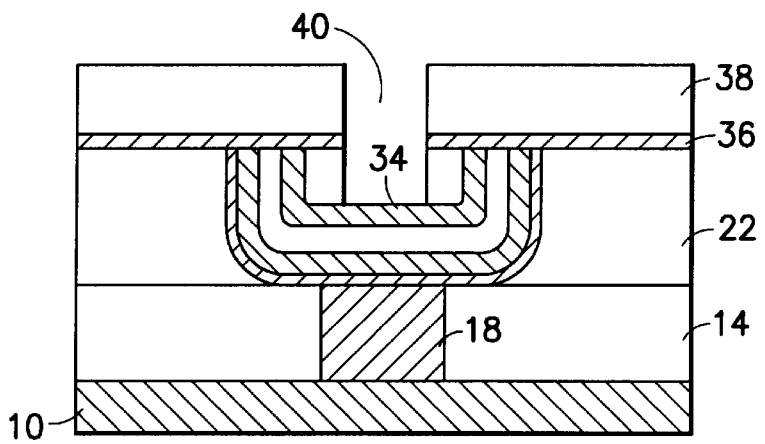

Vias 40 are opened in the barrier layer and ILD using photolithography and dry-etching (FIG. 3G).

Figure 3H:
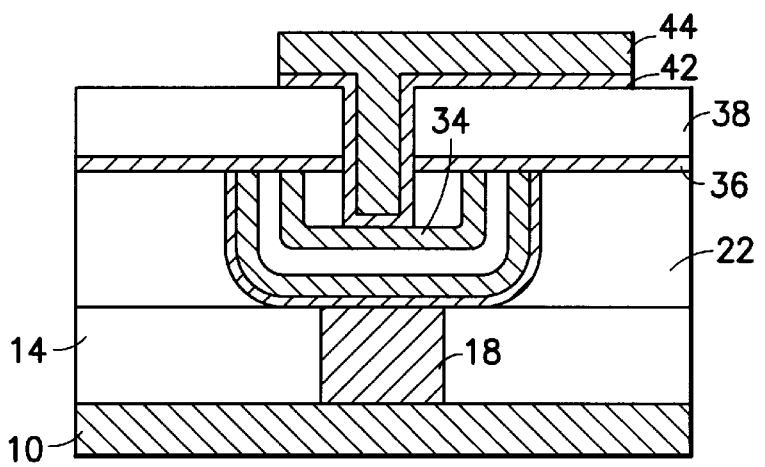

Finally, as shown in FIG. 3H, a diffusion barrier 42 of a material such as TiN, WN or other suitable material is deposited using CVD or sputtering, and metallization 44 is deposited over that barrier, in order to conformally fill the via. The metallization may be CVD-applied W or Al that is sputtered at high temperatures or reflowed, or Cu, or Al-Cu alloys, or other conductive materials. The metallization is then patterned using photolithography and dry-etching and the structure is passivated (not shown) using conventional methods using $SiO_2$, polymers or insulating media.

In the above-described process flow for patterning submicron ferroelectric capacitors in a stack capacitor configuration, chemical vapor deposition (CVD) of the ferroelectric, electrode and barrier layers is desirably employed for feature sizes below 0.35 micron.

The present invention involves a process for improving metallization coverage of steps, vias, and trenches. By alternately sputtering and etching the metal conductive barrier 28 and/or the metal bottom (BE) and top (TE) electrodes, 30 and 34, respectively, the conformality of the layers is improved.

In one preferred embodiment of the invention, an initial etch step is used to condition the patterned substrate surface. A first metal film is deposited with a heated substrate and low deposition rate. Next, a first film etch step is used to re-sputter the first metal film conformally onto the sidewalls of the trench. These two unit processes (deposition/etch) are repeated sequentially until a desired total thickness is achieved of a composite metallization layer such as a noble metal electrode and/or a barrier metal layer. A low metal deposition rate, preferably less than 1 nm/sec, is achieved by sputtering at low power, typically less than 1 kW, and more preferably less than 0.5 kW.

The initial sputtering step is carried out via an ionized magnetron sputter deposition process which bombards a metal target material to loosen ions (i.e. adions) that are then directed onto the inner surface of the trench or via to form a deposited layer. In one preferred embodiment, this process is performed using the deposition module of a Novellus M2i Cluster Tool. The substrate on which the recess or via is formed is preheated and a low energy (a few tens of electron volts) ion bombardment is used. These deposition conditions make the sputtered adions more mobile on the inner surface of the trench or via which improves filling of nano-scale voids at sharp edges. Enhanced surface mobility may further improve film quality by increasing both the density and smoothness of the deposited layers.

The metal deposition sequences are preferentially carried out with the use of a directional grating such as a collimator. The use of a collimator, although it reduces the metal flux reaching the substrate, increases the fraction of incident metal ions that are at or near normal incidence to the substrate.

Ionized magnetron sputter deposition techniques are known in the art. Such a technique is described in an article "Simulations of trench-filling profiles under ionized magnetron sputter metal deposition" by S. Hamaguchi and S. M. Rossnagel, J. Vac. Sci. Technol., Vol. 13, Page 183 (1995) and is hereby incorporated by reference. Other sputtering techniques such as reactive sputtering and ion beam sputtering that provide a metal film on the inner surfaces of the trench may also be used.

Preheating the substrate in which the trench is formed and use of a low energy (a few tens of electron volts) ion bombardment are known in the art. These techniques are described in an article "Thin Film Processes II" by John L. Vossen and Werner Kern, Academic Press, Inc. hereby incorporated by reference.

Typical processing conditions for the sputtering step to deposit a noble or barrier metal film, for example, Ir over a trench, via or step are given in table 1.

TABLE 1

| Parameter | Preferred Value | (Range of Value) |
|---|---|---|
| Sputtering mode | DC magnetron | |
| Target-substrate distance | 43 mm | (30–100) |
| Power | 0.5 kW | (0.3–0.7) |
| Working gas, flow rate | Ar, 120 sccm | (50–200) |
| Substrate temperature | 500° C. | (450–550) |
| Collimation | Yes | |

During the plasma etching step, a high energy plasma beam is incident on the metal layer deposited during the sputtering step. According to a preferred embodiment, this step is carrier out using the etch module of a Novellus M2i Cluster Tool. As the beam etches, sputtering takes place and ions are desorbed from the layer and redistributed on the sidewalls in a $cos\theta$ distribution. This redistribution, at superthermal energies, involves impingement angles which are at nearly normal incidence on the sidewall, resulting in uniform sidewall coverage, and a highly dense, non-columnar microstructure.

Such a plasma etching technique is known in the art and described in an article, "Microprofile simulations for plasma etching with surface passivation" J. Vac. Sci. Technol. A., Vol. 125, p. 2745 (1994) hereby incorporated by reference.

Typical processing conditions for the second etch step to deposit a highly uniform and dense noble metal or barrier metal film, for example, Ir on the sidewalls of the trench are given in table 2. Iridium etch rates, for the preferred conditions shown in table 2, are approximately 5 A/sec.

TABLE 2

| Parameter | Preferred Value | (Range of Value) |
|---|---|---|
| Etch mode | RF ion milling | |
| Power | 0.3 kW | 0.3–1.0 |
| Pressure | 1.5 mTorr | 1–3 |
| Working gas, flow rate | Ar, 50 sccm | 30–60 |
| Substrate temperature | 450° C. | 400–550 |
| Substrate bias | −231 V | −250—100 |

The number of (deposition and etch) cycles used to deposit a single discrete metal film depends on the duty cycle and process parameters chosen for each component of the process. The number of cycles is at least 2 and may be 20 or more, depending on the processing parameters and additional economic considerations such as the total thickness sought, cost, process time, etc.

The sequential application of the deposition and etching steps may be accomplished a) in a singular vacuum system by switching between dedicated deposition and etch modules, or b) in a singular vacuum system using a multi-faceted deposition/RI-etch module, or alternatively, c) the steps may be carried out in independent deposition and etch systems.

A further embodiment of the present invention involves a simultaneous deposition and etch step. This may be accomplished a) in addition to the sequential application of dedicated (independent) deposition and etch steps as described above by, for example, temporally grading the transition from deposition to etch (or vice versa) by adjustment of the substrate bias voltage duty cycle. Here the transition between deposition and etch is not well defined. Additionally, b) a simultaneous deposition and etch step may constitute the full extent of the process, where the process parameters either sit fixed (in a mixed deposition/etch condition) or temporarily vary between settings that are considered neither 100% deposition nor 100% etch conditions but which vary the extent of deposition and etch. For example, the duty cycle can vary through the process so as to favor more deposition at the onset of the process and more etch at the end—or vice versa.

Following the deposition and etch protocols outlined above, a post-deposition anneal of the metal film, prior to deposition of the high dielectric or ferroelectric layer, may be used to change the grain structure of the metal and further improve its resistance to diffusion of $O_2$, Pb, or Bi.

While the preferred embodiments of the invention have been shown and described, numerous variations and alternative embodiments will occur to those skilled in the art. Accordingly, it is intended that the invention be limited only in terms of the appended claims.

What is claimed is:

1. A method for depositing a conformal thin film over a semiconductor substrate, the surface of said substrate containing three-dimensional structures, comprising the steps of:
   a. heating said substrate,
   b. depositing material to form a first film substantially covering horizontal surfaces on said substrate,
   c. etching said first film so as to re-sputter material from said horizontal surfaces onto vertical surfaces of said three-dimensional structures,
   d. repeating said depositing and etching steps to form a composite conformal thin film layer.

2. The method of claim 1 wherein said first film etch is comprised of a plasma etch.

3. The method of claim 2 wherein an initial etch step precedes the deposition step.

4. The method of claim 2 wherein the number of deposition and first film etch cycles is 2.

5. The method of claim 2 wherein the number of deposition and first film etch cycles is between 3 and 10.

6. The method of claim 2 wherein each first film etch step removes at least 25% of material deposited during previous deposition step.

7. The method of claim 2 wherein the deposition and etch cycle concludes with a deposition step.

8. The method of claim 2 wherein said first film is a metal film deposited by an ionized magnetron sputter deposition process.

9. The method of claim 2 wherein said first film is a metal film deposited by a reactive sputtering process.

10. The method of claim 2 wherein the deposition cycle utilizes a directional grating.

11. The method of claim 10 wherein the directional grating is a collimator.

12. The method of claim 2 wherein said first film is selected from the group consisting of an oxide, nitride or oxy-nitride film.

13. The method of claim 2 wherein said thin first film is an electrically conductive film.

14. The method of claim 13 wherein said conductive film is selected from the group consisting of a noble metal or noble metal oxide.

15. The method of claim 14 wherein said conductive film is selected from the group consisting of iridium, iridium oxide, ruthenium, ruthenium oxide, and platinum.

16. The method of claim 15 wherein the substrate temperature is between 300–600° C.

17. The method of claim 16 wherein the deposition power is less than 1 kW.

18. A method for depositing a conformal thin film over a semiconductor substrate, the surface of said substrate containing three-dimensional structures, comprising the steps of:
   a. heating said substrate,
   b. depositing material to form a first film substantially covering horizontal surfaces on said substrate,
   c. plasma etching said first film so as to re-sputter material from said horizontal surfaces onto vertical surfaces of said three-dimensional structures,
   d. repeating said depositing and etching steps to form a composite conformal thin film layer.

19. The method of claim 18 wherein an initial etch step precedes the deposition step.

20. The method of claim 19 wherein the number of deposition and plasma etch cycles is 2.

21. The method of claim 19 wherein the number of deposition and plasma etch cycles is between 3 and 10.

22. The method of claim 21 wherein each plasma etch step removes at least 25% of material deposited during previous deposition step.

23. The method of claim 22 wherein the deposition and etch cycle concludes with a deposition step.

24. The method of claim 23 wherein said thin first film is selected from the group consisting of an oxide, nitride or oxy-nitride film.

25. The method of claim 23 wherein said thin first film is an electrically conductive film.

26. The method of claim 25 wherein said conductive film is deposited by an ionized magnetron sputter deposition process.

27. The method of claim 25 wherein said conductive film is deposited by a reactive sputtering process.

28. The method of claim 25 wherein the conductive film is deposited by an ion beam sputtering process.

29. The method of claims 26, 27 and 28 wherein the sputter deposition process utilizes a directional grating.

30. The method of claim 29 in which said directional grating is a collimator.

31. The method of claim 29 wherein said conductive film is selected from the group consisting of a noble metal or noble metal oxide.

32. The method of claim 31 wherein said noble metal film is selected from a group consisting of iridium, iridium oxide, ruthenium, ruthenium oxide, and platinum.

33. The method of claim 32 wherein the substrate temperature is between 300–600° C.

34. The method of claim 33 wherein the sputter power is less than 1 kW.

35. A method for depositing a conformal thin film over a semiconductor substrate, the surface of said substrate containing three-dimensional structures, comprising the steps of:
   a. heating said substrate,
   b. etching said substrate in an initial plasma etch,
   c. simultaneously depositing and plasma etching a noble metal to form a conformal film substantially covering horizontal and vertical surfaces on three-dimensional structures, said noble metal deposited by an ionized magnetron sputter deposition process where the substrate temperature is at least 400° C. and the deposition power is less than 1 kW.

36. The method of claim 35 wherein said noble metal film is selected from the group consisting of iridium, ruthenium, and platinum.

37. The method of claim 35 wherein the sputtering and plasma etching parameters are systematically varied throughout the deposition process.

38. A method for depositing a conformal thin film over a semiconductor substrate, the surface of said substrate containing three-dimensional structures, comprising the steps of:
   a. heating said substrate,
   b. etching said substrate in an initial plasma etch,
   c. simultaneously depositing and plasma etching a noble-metal oxide to form a conformal film substantially covering horizontal and vertical surfaces on three-dimensional structures, said noble metal deposited by an ionized magnetron sputter deposition process where the substrate temperature is at least 400° C. and the deposition power is less than 1 kW.

39. The method of claim 38 wherein said noble metal oxide film is selected from the group consisting of iridium oxide and ruthenium oxide.

40. The method of claim 38 wherein the sputtering and plasma etching parameters are systematically varied throughout the deposition process.

41. A method for depositing a conformal thin film over a semiconductor substrate, the surface of said substrate containing three-dimensional structures, comprising the steps of:
   a. heating said substrate,
   b. depositing a conductive barrier layer on said substrate said conductive barrier layer suitable to withstand oxidation and prevent oxidation of said substrate,
   c. depositing material to form a second film substantially covering horizontal surfaces on said substrate,
   d. etching said second film so as to re-sputter material from said horizontal surfaces onto vertical surfaces of said three-dimensional structures,
   e. repeating said depositing and etching steps to form a composite conformal thin film layer.

42. The method of claim 41 wherein said second film etch is comprised of a plasma etch.

43. The method of claim 42 wherein an initial etch step precedes the deposition step.

44. The method of claim 42 wherein said conductive barrier layer is selected from the group consisting of TiN, TiSiN, TiAlN, $IrO_2$, SiC, PdSiN, metal suicides, or metal carbides.

45. The method of claim 42 wherein said thin second film is a conductive film.

46. The method of claim 45 wherein said conductive film is selected from the group consisting of a noble metal or noble metal oxide.

47. The method of claim 46 wherein said noble metal or noble metal oxide are selected from the group consisting of iridium, iridium oxide, ruthenium, ruthenium oxide, and platinum.

48. A method for depositing a conformal thin film over a semiconductor substrate, the surface of said substrate containing three-dimensional structures, comprising the steps of:
   a. heating said substrate,
   b. depositing material to form a first film substantially covering horizontal surfaces on said substrate, said first film capable of functioning as an electrode and as a conductive barrier layer suitable to withstand oxidation and prevent diffusion of said substrate,
   c. etching said first film so as to re-sputter material from said horizontal surfaces onto vertical surfaces of said three-dimensional structures,
   d. repeating said depositing and etching steps to form a composite conformal thin film layer.

49. The method of claim 48 wherein said first film etch is comprised of a plasma etch.

50. The method of claim 49 wherein an initial etch step precedes the deposition step.

* * * * *

UNITED STATES PATENT AND TRADEMARK OFFICE
CERTIFICATE OF CORRECTION

PATENT NO : 6,100,200
DATED : August 8, 2000
INVENTOR(S) : Peter C. Van Buskirk, et al.

It is certified that error appears in the above-identified patent and that said Letters Patent is hereby corrected as shown below:

On the title page, item

[75] Inventors: after "Theodore S. Moise" insert --Francis G. Celii--

Column 6, line 46 of Table 2, cancel "-250—100" and substitute -- -250 - -100 --

Column 10, line 9, cancel "suicides" and substitute --silicides--.

Signed and Sealed this

Seventeenth Day of April, 2001

Attest:

NICHOLAS P. GODICI

Attesting Officer

Acting Director of the United States Patent and Trademark Office